United States Patent
Yen et al.

(10) Patent No.: US 9,350,388 B2
(45) Date of Patent: May 24, 2016

(54) DATA FORMAT WITH ECC INFORMATION FOR ON-THE-FLY DECODING DURING DATA TRANSFER AND METHOD FOR FORMING THE DATA FORMAT

(71) Applicant: Storart Technology Co., Ltd., Hsinchu (TW)

(72) Inventors: Chih Nan Yen, Hsinchu (TW); Jui Hui Hung, Hsinchu (TW)

(73) Assignee: Storart Technology Co. Ltd., Hsinchu (TW)

( * ) Notice: Subject to any disclaimer, the term of this patent is extended or adjusted under 35 U.S.C. 154(b) by 42 days.

(21) Appl. No.: 14/200,544

(22) Filed: Mar. 7, 2014

(65) Prior Publication Data

US 2015/0256199 A1  Sep. 10, 2015

(51) Int. Cl.
*H03M 13/13* (2006.01)
*G06F 11/10* (2006.01)
*H03M 13/11* (2006.01)
*H04L 1/00* (2006.01)
*H03M 13/00* (2006.01)

(52) U.S. Cl.
CPC .......... *H03M 13/116* (2013.01); *H03M 13/616* (2013.01); *H04L 1/00* (2013.01)

(58) Field of Classification Search
CPC ...... H03M 13/13; H03M 13/116; G06F 11/10
See application file for complete search history.

(56) References Cited

U.S. PATENT DOCUMENTS

| | | | |
|---|---|---|---|
| 2005/0138518 A1* | 6/2005 | Cideciyan | G11B 20/1833 714/752 |
| 2010/0098245 A1* | 4/2010 | Fang et al. | 380/38 |
| 2010/0122143 A1* | 5/2010 | Lee et al. | 714/752 |
| 2010/0275088 A1* | 10/2010 | Graef | 714/752 |
| 2011/0087948 A1* | 4/2011 | Murakami | H03M 13/1154 714/758 |
| 2011/0154160 A1* | 6/2011 | Yurzola et al. | 714/763 |
| 2011/0197105 A1* | 8/2011 | Murakami et al. | 714/752 |

* cited by examiner

*Primary Examiner* — Albert Decady
*Assistant Examiner* — Kyle Vallecillo
(74) *Attorney, Agent, or Firm* — Che-Yang Chen; Law Offices of Scott Warmuth

(57) ABSTRACT

A data format with ECC information for on-the-fly decoding during data transfer and method for forming the data format are disclosed. The method includes the steps of: dividing a parity check matrix having a message segment and a parity segment into a plurality of layers; choosing parity bit nodes in the parity segment of a first layer connected to check nodes; assembling the chosen parity bit nodes as a first parity segment and the rest parity bit nodes as a second parity segment; reallocating the parity check matrix so that the first parity segment is on the head of the message segment and the second parity segment is on the end of the message segment; forming a generating matrix according to the reallocated parity check matrix; and operating a message with the generating matrix to obtain the codeword.

16 Claims, 10 Drawing Sheets

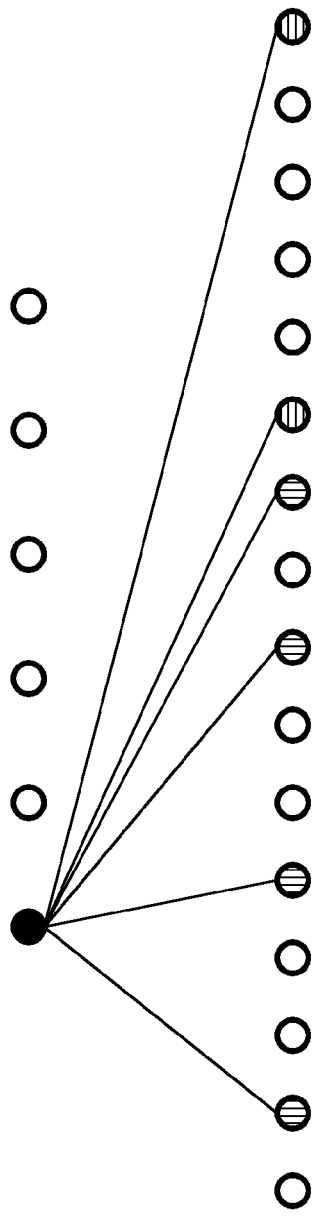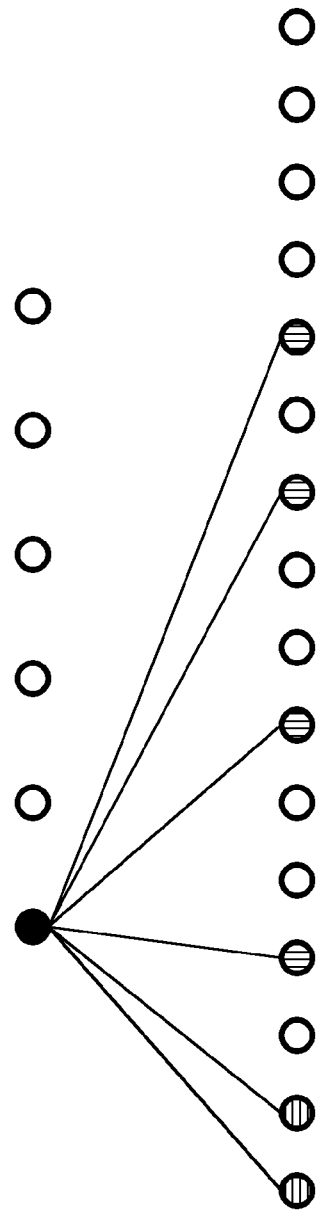
Fig. 6

| First Message Part | First Parity Part | Second Message Part | Second Parity Part |

Fig. 9

DATA FORMAT WITH ECC INFORMATION FOR ON-THE-FLY DECODING DURING DATA TRANSFER AND METHOD FOR FORMING THE DATA FORMAT

FIELD OF THE INVENTION

The present invention relates to a data format with Error Correction Code (ECC) information. More particularly, the present invention relates to a data format with ECC information for on-the-fly decoding during data transfer and a method for forming the data format.

BACKGROUND OF THE INVENTION

ECC can check and correct messages having errors by adding some redundant information. The errors may be incurred during transmission from a source to a receiver or due to defects of a storage device. For storage devices, ECC has been widely adopted to increase the reliability of data access and hence reduce the manufacturing costs. As increase of bit density and multiple-layers manufacturing processes of flash devices, the ECC plays a more and more important role. However, in order to have benefits from ECC, time of encoding and decoding processes will significantly reduce data access time.

To encode messages, one should feed the messages into an encoder provided with an adopted ECC and store an encoded data into a flash memory. Conventionally, in order to reduce waiting time, the messages will be bypassed to flash memory until the parity bits have been generated as shown in FIG. 1. Thus, the parity bits should be appended to the end of the messages in the flash memory as shown in FIG. 2.

Conventionally, to decode the data stored in the flash memory, the data fed into the ECC decoder should be with the same order as encoded data. The decoding process is shown in FIG. 2 as well. However, the decoding procedure cannot be started until the decoder receives the parity part. Besides, the length of buffer for data temporary storage also needs to be enlarged.

A Low-Density Parity Check (LDPC) code is an ECC that may be used in the transmission of information through a noisy communications channel, with or without memory. LDPC codes may be represented by many different types of parity check matrices. The structure of an LDPC code's parity check matrix may be, for example, random, cyclic, or quasi-cyclic. LDPC codes defined by quasi-cyclic parity check matrices are particularly common and computationally efficient. These codes are known as Quasi-Cyclic Low-Density Parity Check (QC-LDPC) codes.

A parity check matrix representative of a specified LDPC code may correspond to a bi-partite graph with check nodes and variable nodes. An LDPC decoder may decode received codewords using an iterative message passing algorithm. Each iteration or sub-iteration includes two updating steps involving the variable nodes and check nodes. In the first updating step, messages may be passed from some check nodes to some variable nodes. In the second updating step, messages may be passed from some variable nodes to some check nodes.

A LDPC decoder may perform the updating steps in accordance with a layered decoding process. In the decoding process, only those variable nodes necessary for updating a particular check node may be updated or only those check nodes necessary for updating a particular variable node may be updated.

A layered LDPC decoder may be used to decode QC-LDPC codes. For a QC-LDPC code with a quasi-cyclic parity check matrix, it is featured that it is consisted of circular sub-matrices (circulants). Since each circulant represents a connection between a check node and a variable node, if circulants in the first layer can be processes first and leave zero sub-matrices behind, decoding process can be speeded up due to less waiting time. Therefore, a data format based on the technique and a parity check matrix for forming that data format are desired so that throughput of the decoder can be increased and input buffer can be reduced.

SUMMARY OF THE INVENTION

A conventional method to decode a QC-LDPC or LDPC codeword has to process calculation after all the messages are received. It takes time to wait for. Therefore, the waiting time needs to be shortened. Furthermore, on-the-fly decoding during data transfer should be achieved.

Hence, according to an aspect of the present invention, a data format of a codeword for achieving on-the-fly decoding during data transfer is disclosed. It includes: a message part for carrying a message; a first parity part, located in the head of the codeword; and a second parity part, located in the end of the codeword. A decoder starts to decode the codeword soon after the first parity part is received.

Another aspect of the present invention is to provide a data format of a codeword including: a first message part for carrying a portion of a message; a second message part for carrying another portion of the message; a first parity part, located between the first message part and the second message; and a second parity part, located in the end of the codeword. A decoder starts to decode the codeword soon after the first parity part is received.

According to still another aspect of the present invention, a data format includes: a number of message parts; and a number of parity parts. The message parts and the parity parts are interleavedly located. One parity part is in the end of the codeword. A decoder can start to decode the codeword soon after one parity part is first received.

Preferable, the codeword is a Quasi-Cyclic Low-Density Parity Check (QC-LDPC) codeword.

According to another aspect of the present invention, a method for forming a data format of a codeword for achieving on-the-fly decoding during data transfer is disclosed. The method has the steps of: dividing a parity check matrix having a message segment and a parity segment into a plurality of layers; choosing parity bit nodes in the parity segment of a first layer connected to check nodes; assembling the chosen parity bit nodes as a first parity segment and the rest parity bit nodes as a second parity segment; reallocating the parity check matrix so that the first parity segment is on the head of the message segment and the second parity segment is on the end of the message segment; forming a generating matrix according to the reallocated parity check matrix; and operating a message with the generating matrix to obtain the codeword.

Still, another aspect of the present invention is a comprising the steps of: dividing a parity check matrix having a message segment and a parity segment into a plurality of layers; choosing parity bit nodes in the parity segment of a first layer connected to check nodes; assembling the chosen parity bit nodes as a first parity segment and the rest parity bit nodes as a second parity segment; dividing the message segment into a first message segment and a second message segment; reallocating the parity check matrix so that the first parity segment is between the first message segment and the second message segment and the second parity segment is on the end of the second message segment; forming a generating matrix according to the reallocated parity check matrix; and operating a message with the generating matrix to obtain the codeword.

Preferably, the codeword mentioned above is a QC-LDPC codeword. The parity bit nodes in the parity segment of the first layer connected to check nodes are identity sub-matrices and/or circulant sub-matrices of the identity matrix while the parity bit nodes in the parity segment of the first layer not connected to check nodes are zero sub-matrices.

Since the decoder can start to decode the codeword soon after the first parity part is received, as long as the first parity part can be arranged in a more shifted location than the original parity part, the waiting time for decoding can be shortened. Furthermore, on-the-fly decoding during data transfer can be achieved.

BRIEF DESCRIPTION OF THE DRAWINGS

FIG. 6 shows comparison of first check node Tanner graphs between the parity check matrices illustrated in FIG. 4 and FIG. 5.

FIG. 9 shows a data format illustrated in the second embodiment.

DETAILED DESCRIPTION OF THE PREFERRED EMBODIMENTS

The present invention will now be described more specifically with reference to the following embodiments.

First Embodiment

Please refer to FIG. 3 to FIG. 7. A first embodiment is illustrated. According to the spirit of the present invention, if a data format of a codeword can achieve on-the-fly decoding during data transfer, the data format should be re-arranged. The inventive data format is with regard to its generating matrix and parity check matrix. Therefore, a conventional parity check matrix and corresponding matrix structure are introduced before the invention is illustrated.

Figure 4:
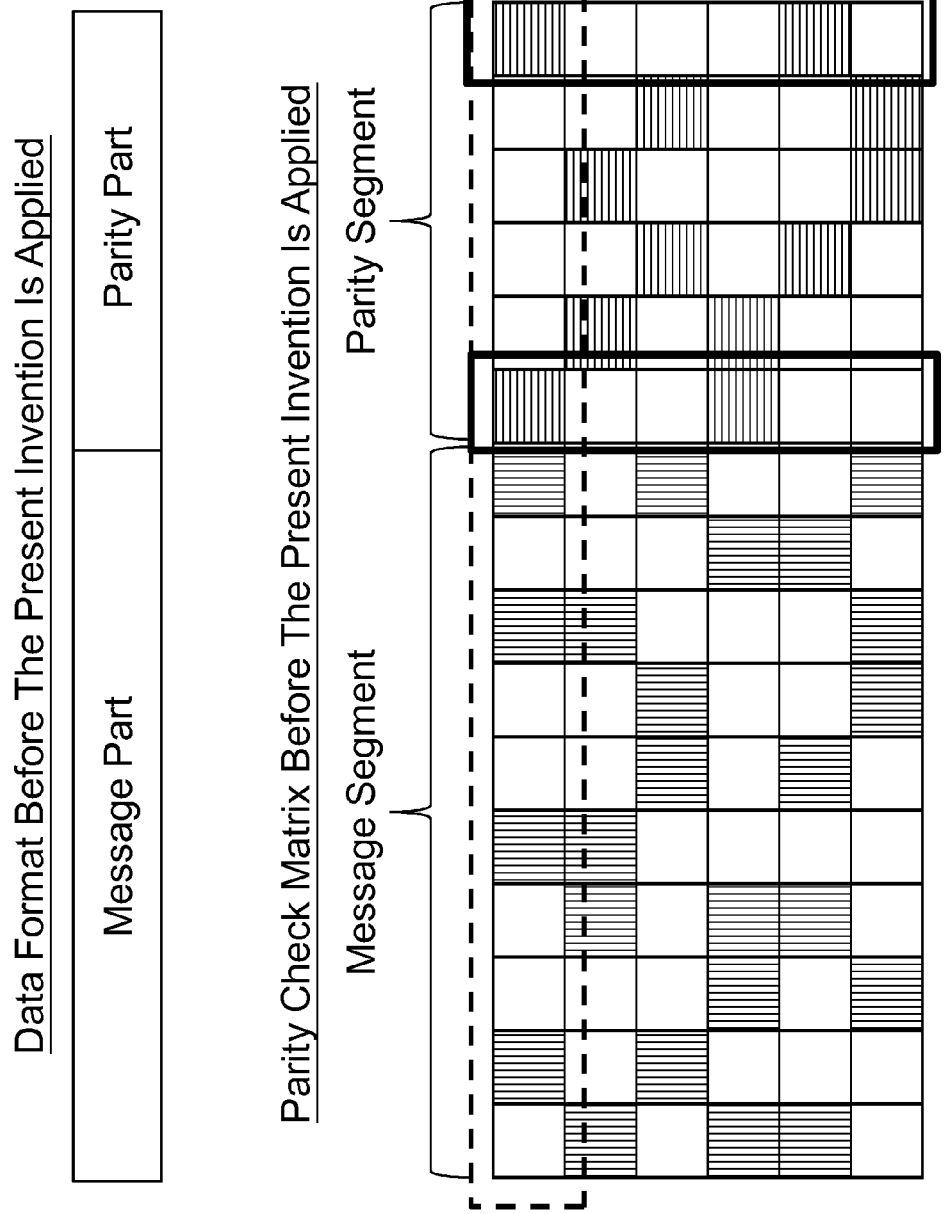
FIG. 4 illustrates a parity check matrix and a data format of a corresponding codeword.

Please see FIG. 4. The conventional parity check matrix for decoding a layered Quasi-Cyclic Low-Density Parity Check (QC-LDPC) codeword includes two segments, a message segment and a parity segment. For simplifying the description, the conventional parity check matrix is called "original" parity check matrix to make a distinction from the one applied with and reformed by the present invention. It is obvious, in this embodiment, the original parity check matrix can be divided into 6 layers. Each layer also has the message segment and the parity segment. In detailed, the message segment and the parity segment can be further separated into several sub-matrices. The original parity check matrix has 96 sub-matrices, arranged in 6 rows and 16 columns. The first layer of the original parity check matrix is enclosed by a dashed frame. Thus, there are 10 sub-matrices in the message segment and 6 sub-matrices in the parity segment. Since the original parity check matrix is a sparse matrix, the sub-matrix should be in from of a zero matrix (zero sub-matrix), an identity matrix (identity sub-matrix) and/or a circulant matrix (circulant sub-matrix) of the identity matrix. If the sub-matrix contains signals, it is marked (vertical lines in the message segment and horizontal lines in the parity segment) to distinguish from zero sub-matrix.

Here, the sub-matrices are p×p matrices. Numeral p could be 64, 128 or more. It should be noticed that the number mentioned above is just exemplary. In practice, the number will be greater than what disclosed aforementioned.

The data format can be formed by using a generating matrix from the original parity check matrix and is shown in the top of the original parity check matrix. The data format contains a message part and a parity part. It is clear that there are parity bit nodes in the parity segment of the first layer connected to check nodes. They are either a sub-matrix or a circulant sub-matrix of the identity sub-matrix. The parity bit nodes are enclosed in solid frames. Otherwise, they are zero sub-matrices. There are two groups of parity bit nodes which connect to check nodes.

Figure 1:
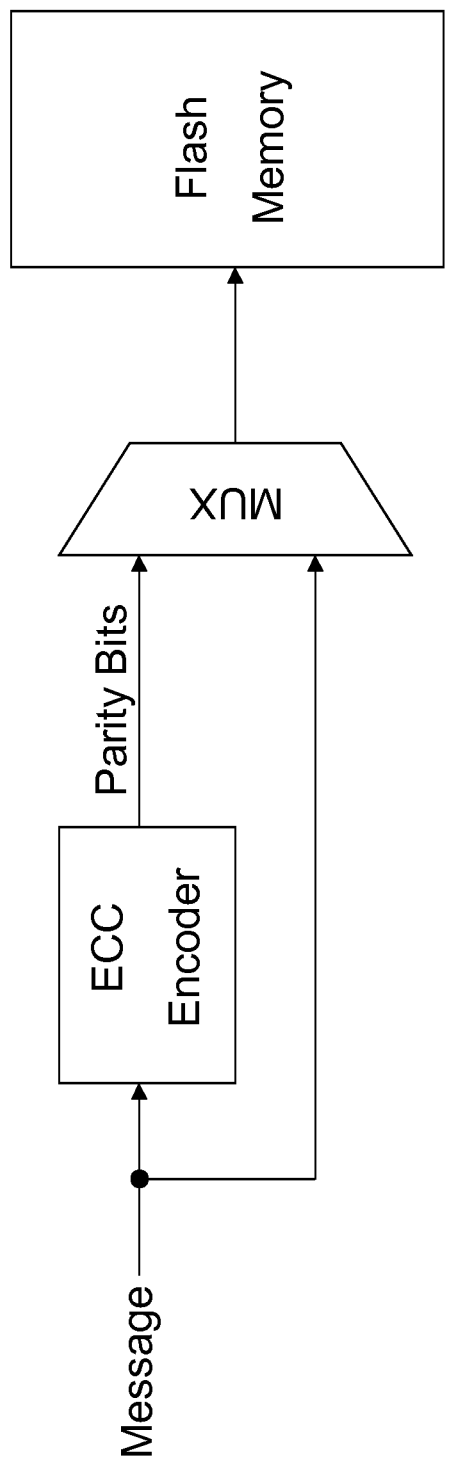
FIG. 1 shows encoding processes of a conventional Error Correction Code (ECC).
Figure 2:
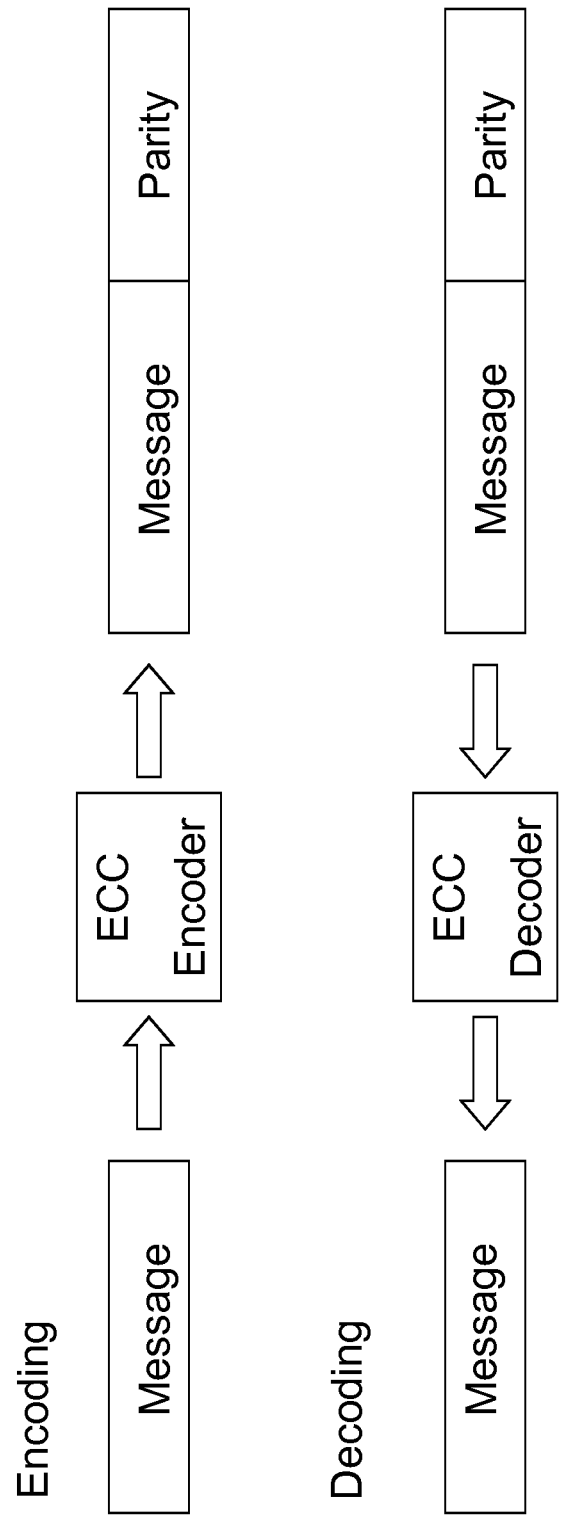
FIG. 2 shows complete coding processes of the conventional ECC.
Figure 3:
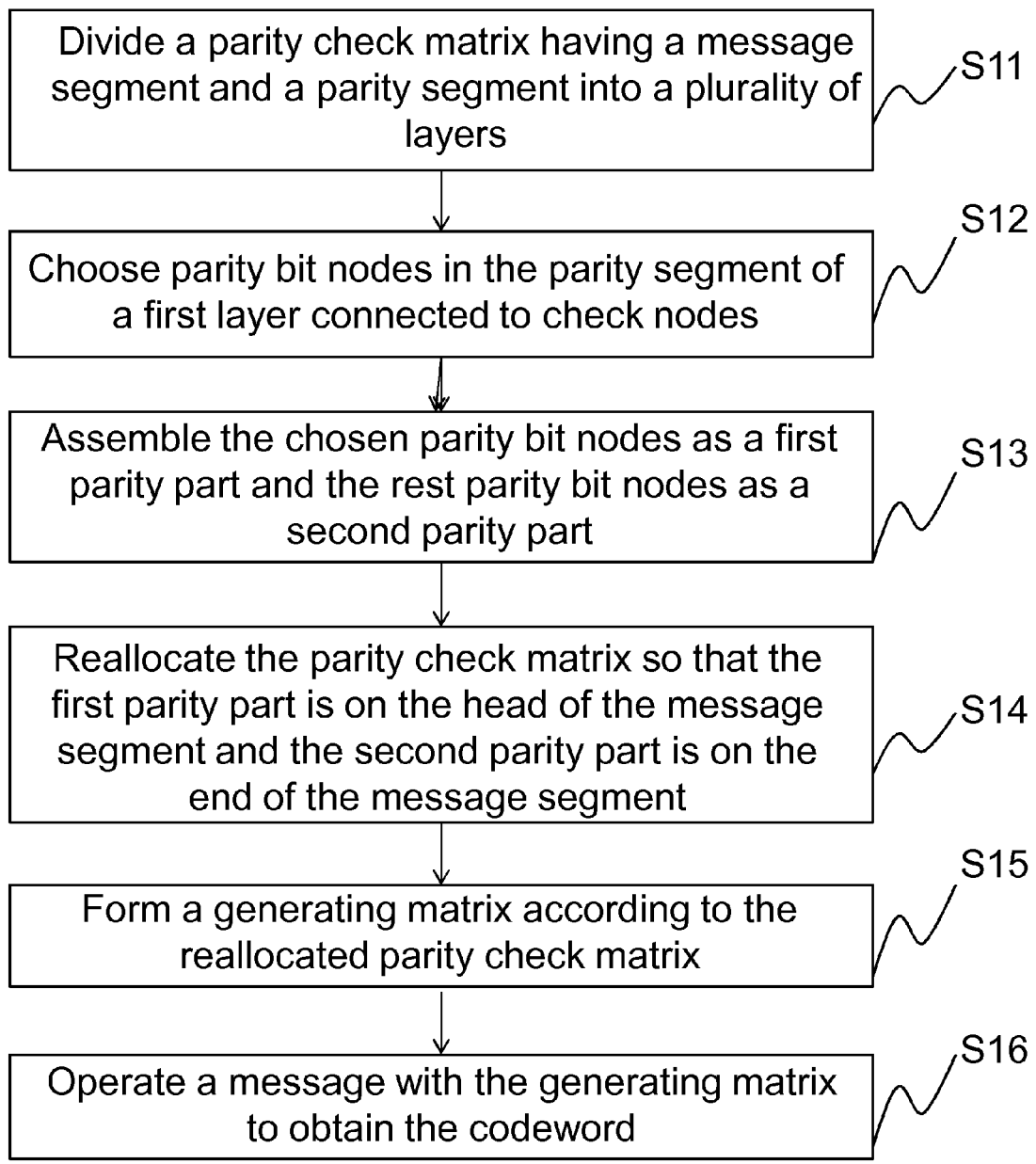
FIG. 3 is a flow chart of a method for forming a data format of a codeword for achieving on-the-fly decoding during data transfer in a first embodiment according to the present invention.
Figure 5:
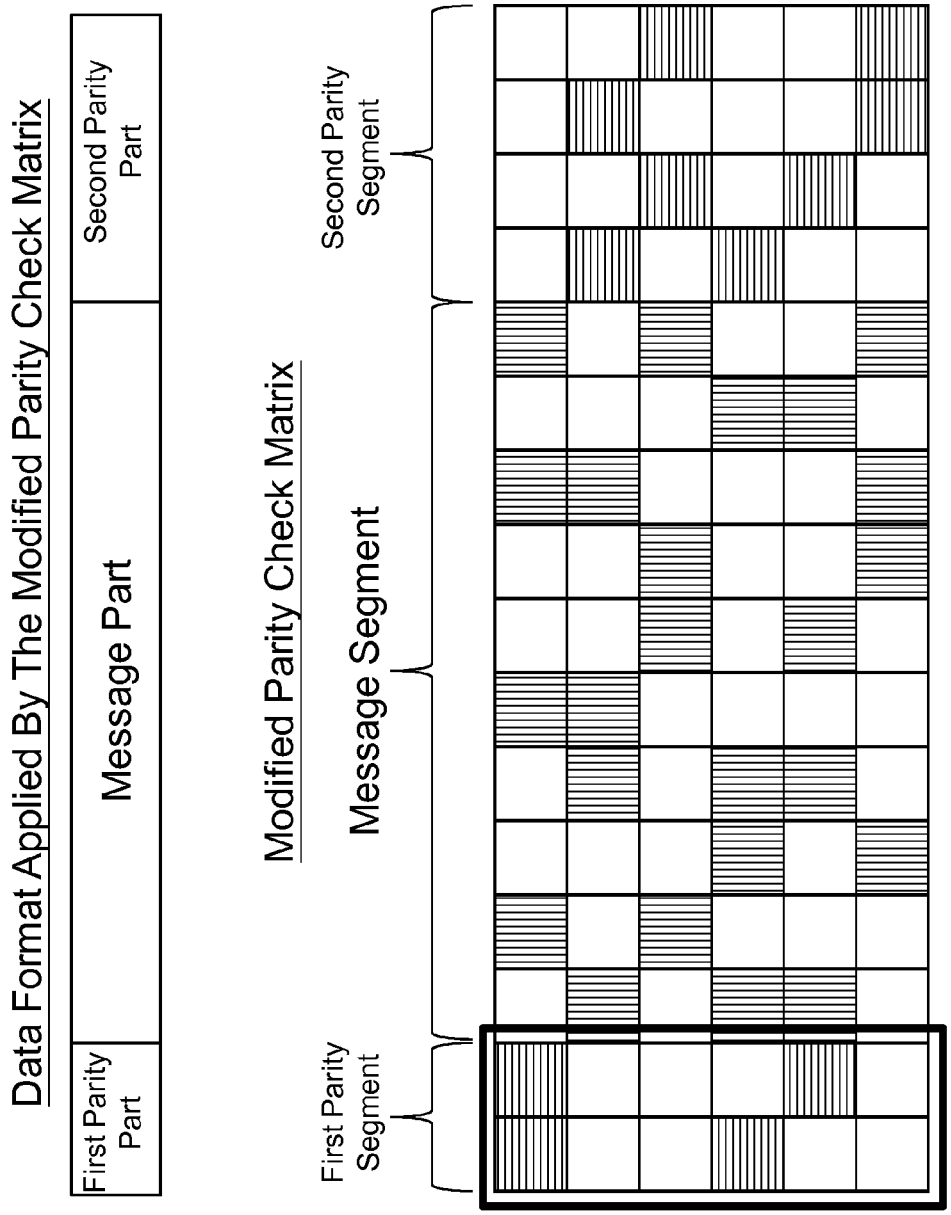
FIG. 5 illustrates a parity check matrix applied by the present invention and a data format of a corresponding codeword.
Figure 7:
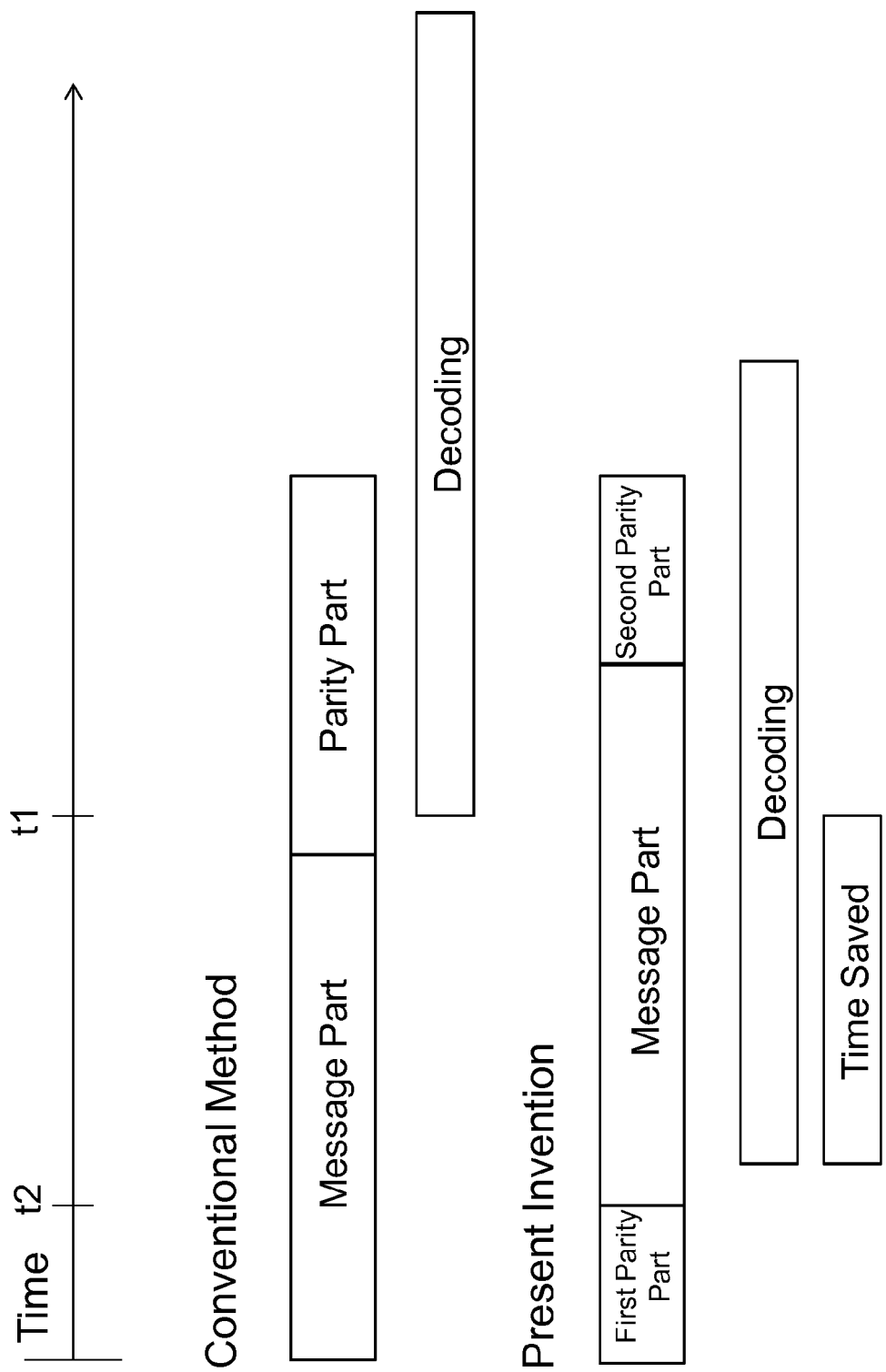
FIG. 7 illustrates timing to start decoding for a conventional method and the present invention.

To initiate the present invention, please refer to FIG. 3 along with FIG. 4 and FIG. 5. FIG. 3 is a flow chart of the method for forming a data format of a codeword for achieving on-the-fly decoding during data transfer according to the present invention and FIG. 5 is a parity check matrix applied with the present invention and a data format of its corresponding codeword. In order to differentiate two parity check matrices mentioned above, the one applied with the present invention is called the "modified" parity check matrix.

First, divide the original parity check matrix shown in FIG. 4 which has a message segment and a parity segment into a number of layers (S11). Here, there are 6 layers. Then, choose the parity bit nodes in the parity segment of a first layer connected to check nodes (S12). After the parity bit nodes are chosen, assemble the chosen parity bit nodes as a first parity segment (enclosed in a solid frame in FIG. 5) and the rest parity bit nodes as a second parity segment (S13). Next, reallocate the original parity check matrix so that the first parity segment is on the head of the message segment and the second parity segment is on the end of the message segment (S14). It is obvious that the original parity check matrix has changed to the modified parity check matrix. Then, form a generating matrix according to the reallocated (modified) parity check matrix (S15). Finally, operate a message with the generating matrix to obtain the codeword (S16). Thus, the data format of the codeword for achieving on-the-fly decoding during data transfer can be available.

Please see the top portion of FIG. 5. The new format has a first parity part, a second parity part and a message part. The first parity part is located in the head of the codeword. The second parity part is located in the end of the codeword. The message part for carrying a message is between the first parity part and the second parity part. Please see FIG. 6. It depicts that Tanner graph of first check nodes of the original parity check matrix has changed to that of the modified parity check matrix. A decoder can start to decode the codeword soon after the first parity part is received. Please see FIG. 7. For a conventional method to decode a QC-LDPC or LDPC codeword, one decoder should start decoding from t1. However, for a re-arranged QC-LDPC or LDPC codeword carrying the same message but in the new format, one corresponding decoder can start decoding at t2. t2 is earlier than t1 so that time for decoding processes can be shortened according to the present invention. This is the advantage that conventional methods can not provide.

Second Embodiment

Figure 10:
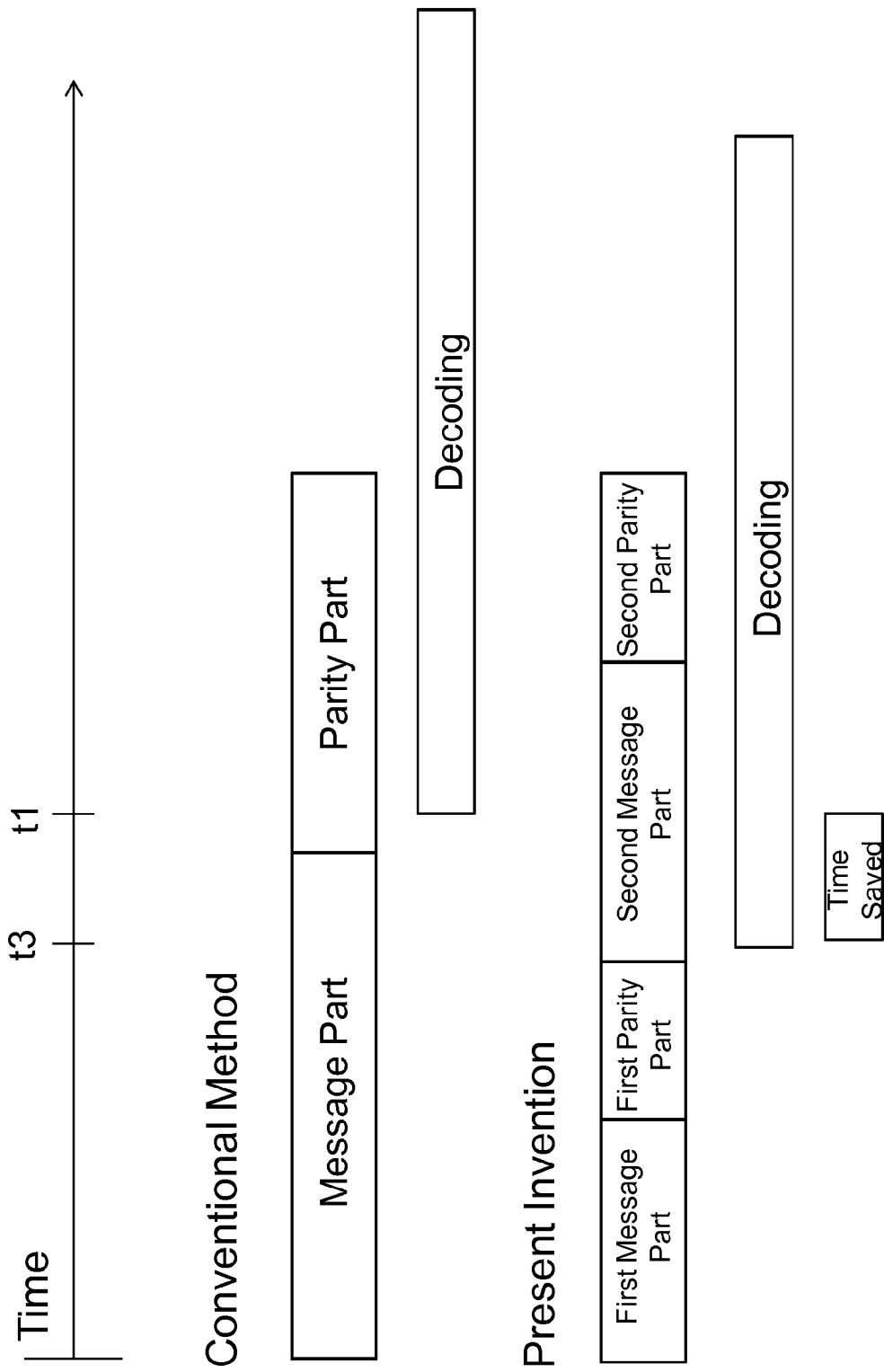
FIG. 10 illustrates timing to start decoding for a conventional method and the present invention.

According to the present invention, the first parity segment in the first embodiment is not only located on the head of the message segment, it can also be "within" the message segment. The method is provided in a second embodiment. Please refer to FIG. 8 to FIG. 10. The second embodiment is illustrated.

Take the original parity check matrix in FIG. 4 in the first embodiment as an example for illustration in the present embodiment. All the structures are inherited from the first embodiment, too.

Figure 8:
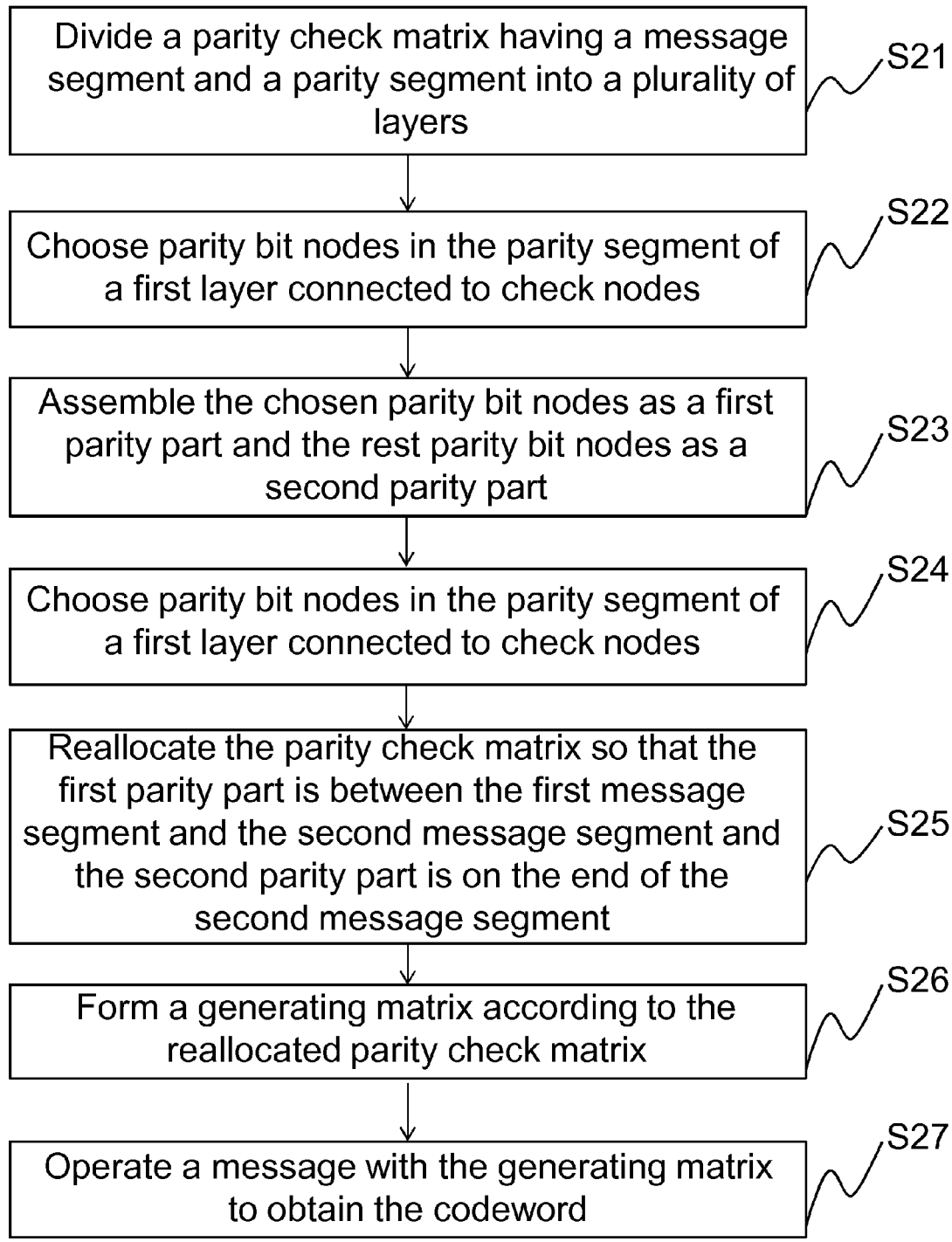
FIG. 8 is a flow chart of a method for forming a data format of a codeword for achieving on-the-fly decoding during data transfer in a second embodiment according to the present invention.

Please see FIG. 8. The method begins form the step of dividing the original parity check matrix having the message segment and the parity segment into a number of layers (S21). There are also 6 layers in the present invention. Choose parity bit nodes in the parity segment of the first layer connected to check nodes (S22). After the parity bit nodes are chosen, assembled the chosen parity bit nodes as a first parity segment and the rest parity bit nodes as a second parity segment (S23). The above steps are the same in the first embodiment. Something different is that the message segment is divided into a first message segment and a second message segment (S24). The parity check matrix is reallocated so that the first parity segment is between the first message segment and the second message segment. The second parity segment is on the end of the second message segment (S25). Next, form a generating matrix according to the reallocated parity check matrix (S26). Finally, operate a message with the generating matrix to obtain the corresponding codeword with new data format (S27).

From FIG. 9 and the corresponding explanation in the first embodiment, one can know that the new data format can have a structure that includes a first parity part, a first message part, a second message and a second parity part sequentially. The first message part carries a portion of the message. The first parity part is located between the first message part and the second message. Namely, the first parity part is within the message segment. The second message part carries another portion of the message with the second parity part appended behind.

As mentioned in the first embodiment, a decoder starts to decode the codeword soon after the first parity part is received. Please see FIG. 10. Let's compare decoding speed according to what disclosed in the present embodiment with that of the conventional method again. For the conventional method to decode a QC-LDPC or LDPC codeword, one decoder should start decoding from t1. For a re-arranged QC-LDPC or LDPC codeword carrying the same message but in the new format, one corresponding decoder can start decoding at t3. t3 is also earlier than t1 so that time for decoding processes can be shortened according to the present invention. However, comparing with t2 in the first embodiment, t3 is behind t2. It means that the locations of the first parity check segment will lead to different initiating time for decoding a codeword. It is preferred to locate the first parity check segment on the head of the message segment.

From an inference of the descriptions above, it can be obtained that a codeword with several message parts the parity parts and the message parts and the parity parts are interleavedly located is also available technically. As long as one parity part is in the end of the codeword, a decoder can start to decode the codeword soon after one parity part is first received. However, this format may occupy more resources to calculation. It might not be practical as that in the first and second embodiments.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims, which are to be accorded with the broadest interpretation so as to encompass all such modifications and similar structures.

What is claimed is:

1. A method for forming a data format of a codeword for achieving on-the-fly decoding during data transfer, comprising the steps of:
   dividing a parity check matrix having a message segment and a parity segment into a plurality of layers;
   choosing parity bit nodes in the parity segment of a first layer connected to check nodes;
   assembling the chosen parity bit nodes as a first parity segment and the rest parity bit nodes as a second parity segment;
   reallocating the parity check matrix so that the first parity segment is on the head of the message segment and the second parity segment is on the end of the message segment;
   forming a generating matrix according to the reallocated parity check matrix; and
   operating a message with the generating matrix to obtain the codeword.

2. The method according to claim 1, wherein the codeword is a Quasi-Cyclic Low-Density Parity Check (QC-LDPC) codeword.

3. The method according to claim 1, wherein the parity bit nodes in the parity segment of the first layer connected to check nodes are identity sub-matrices and/or circulant sub-matrices of the identity matrix.

4. The method according to claim 1, wherein the parity bit nodes in the parity segment of the first layer not connected to check nodes are zero sub-matrices.

5. A method for forming a data format of a codeword for achieving on-the-fly decoding during data transfer, comprising the steps of:
   dividing a parity check matrix having a message segment and a parity segment into a plurality of layers;
   choosing parity bit nodes in the parity segment of a first layer connected to check nodes;
   assembling the chosen parity bit nodes as a first parity segment and the rest parity bit nodes as a second parity segment;
   dividing the message segment into a first message segment and a second message segment;
   reallocating the parity check matrix so that the first parity segment is between the first message segment and the second message segment and the second parity segment is on the end of the second message segment;
   forming a generating matrix according to the reallocated parity check matrix; and operating a message with the generating matrix to obtain the codeword.

6. The method according to claim 5, wherein the codeword is a QC-LDPC codeword.

7. The method according to claim 5, wherein the parity bit nodes in the parity segment of the first layer connected to check nodes are identity sub-matrices and/or circulant sub-matrices of the identity matrix.

8. The method according to claim 5, wherein the parity bit nodes in the parity segment of the first layer not connected to check nodes are zero sub-matrices.

9. A data format formed according to the method of claim 1.

10. The data format according to claim 9, wherein the data format comprises:
 a message part for carrying a message;
 a first parity part, located in the head of the codeword; and
 a second parity part, located in the end of the codeword,
 wherein a decoder starts to decode the codeword soon after the first parity part is received.

11. The data format according to claim 9, wherein the data format comprises:
 a first message part for carrying a portion of a message;
 a second message part for carrying another portion of the message;
 a first parity part, located between the first message part and the second message; and
 a second parity part, located in the end of the codeword,
 wherein a decoder starts to decode the codeword soon after the first parity part is received.

12. The data format according to claim 9, wherein the data format comprises:
 a plurality of message parts; and
 a plurality of parity parts,
 wherein the message parts and the parity parts are interleavedly located, one of the parity parts is in the end of the codeword, and a decoder starts to decode the codeword soon after one of the parity parts is first received.

13. A data format formed according to the method of claim 5.

14. The data format according to claim 13, wherein the data format comprises:
 a message part for carrying a message;
 a first parity part, located in the head of the codeword; and
 a second parity part, located in the end of the codeword,
 wherein a decoder starts to decode the codeword soon after the first parity part is received.

15. The data format according to claim 13, wherein the data format comprises:
 a first message part for carrying a portion of a message;
 a second message part for carrying another portion of the message;
 a first parity part, located between the first message part and the second message; and
 a second parity part, located in the end of the codeword,
 wherein a decoder starts to decode the codeword soon after the first parity part is received.

16. The data format according to claim 13, wherein the data format comprises:
 a plurality of message parts; and
 a plurality of parity parts,
 wherein the message parts and the parity parts are interleavedly located, one of the parity parts is in the end of the codeword, and a decoder starts to decode the codeword soon after one of the parity parts is first received.

* * * * *